(12) United States Patent
Kuhara et al.

(10) Patent No.: US 6,824,313 B2
(45) Date of Patent: Nov. 30, 2004

(54) OPTICAL RECEIVER MODULE

(75) Inventors: Yoshiki Kuhara, Osaka (JP); Naoyuki Yamabayashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 147 days.

(21) Appl. No.: 10/355,832

(22) Filed: Jan. 31, 2003

(65) Prior Publication Data

US 2003/0219218 A1 Nov. 27, 2003

(30) Foreign Application Priority Data

Feb. 7, 2002 (JP) ........................................ 2002-031296

(51) Int. Cl.$^7$ .............................................. G02B 6/36
(52) U.S. Cl. .......................... 385/88; 385/49; 385/92; 385/14; 385/129
(58) Field of Search .............................. 385/49, 88, 89, 385/92, 94, 129, 130, 131, 14

(56) References Cited

U.S. PATENT DOCUMENTS

| | | | | |
|---|---|---|---|---|
| 5,521,736 A | * | 5/1996 | Swirhun et al. ............ | 398/154 |
| 6,406,196 B1 | * | 6/2002 | Uno et al. ................... | 385/89 |
| 6,433,927 B1 | * | 8/2002 | Nyman et al. ............... | 359/343 |
| 6,618,405 B2 | * | 9/2003 | Kimura et al. ............... | 372/36 |
| 6,663,296 B1 | * | 12/2003 | Blair et al. ................... | 385/92 |
| 2002/0063952 A1 | * | 5/2002 | Nyman et al. ............... | 359/342 |
| 2003/0072541 A1 | * | 4/2003 | Ban et al. ..................... | 385/92 |
| 2004/0033032 A1 | * | 2/2004 | Nakanishi et al. ........... | 385/92 |
| 2004/0105627 A1 | * | 6/2004 | Hargis et al. ................ | 385/88 |

FOREIGN PATENT DOCUMENTS

JP 09054228 A 2/1997 ............... 385/88 X

\* cited by examiner

*Primary Examiner*—Brian M. Healy
(74) *Attorney, Agent, or Firm*—Fish & Richardson P.C.

(57) ABSTRACT

In a surface-mounted optical receiver module comprising a substrate, a photodiode serving as a light receiving device for converting an optical signal into an electrical signal, an optical waveguide serving as an optical transmission line for transmitting the optical signal to the photodiode, and an amplifier device for amplifying the electrical signals, the amplifier device is placed at a predetermined position on the upper surface of the optical waveguide element, which is on the same side as an optical waveguide (on the upstream side in the optical-signal transmitting direction) relative to the photodiode. This configuration eliminates the necessity of additionally securing a space to provide the amplifier device, whereby the size of the optical transmission module can be reduced, and this allows the optical receiver module to receive optical signals at high speed.

9 Claims, 11 Drawing Sheets

PRIOR ART

FIG. 10

PRIOR ART

FIG. 11

PRIOR ART

OPTICAL RECEIVER MODULE

BACKGROUND OF THE INVENTION

1. Field of the Invention

The present invention relates to an optical receiver module having a light receiving device that converts an optical signal into an electrical signal.

2. Description of the Background Art

In optical communication systems using light as an optical transmission means, optical receiver modules having light receiving devices for converting optical signals into electrical signals are used as receiving equipment for receiving optical signals through optical transmission lines such as optical fiber lines (Refer to Japanese Patent Application Publication No. 9-54228).

Figure 9:
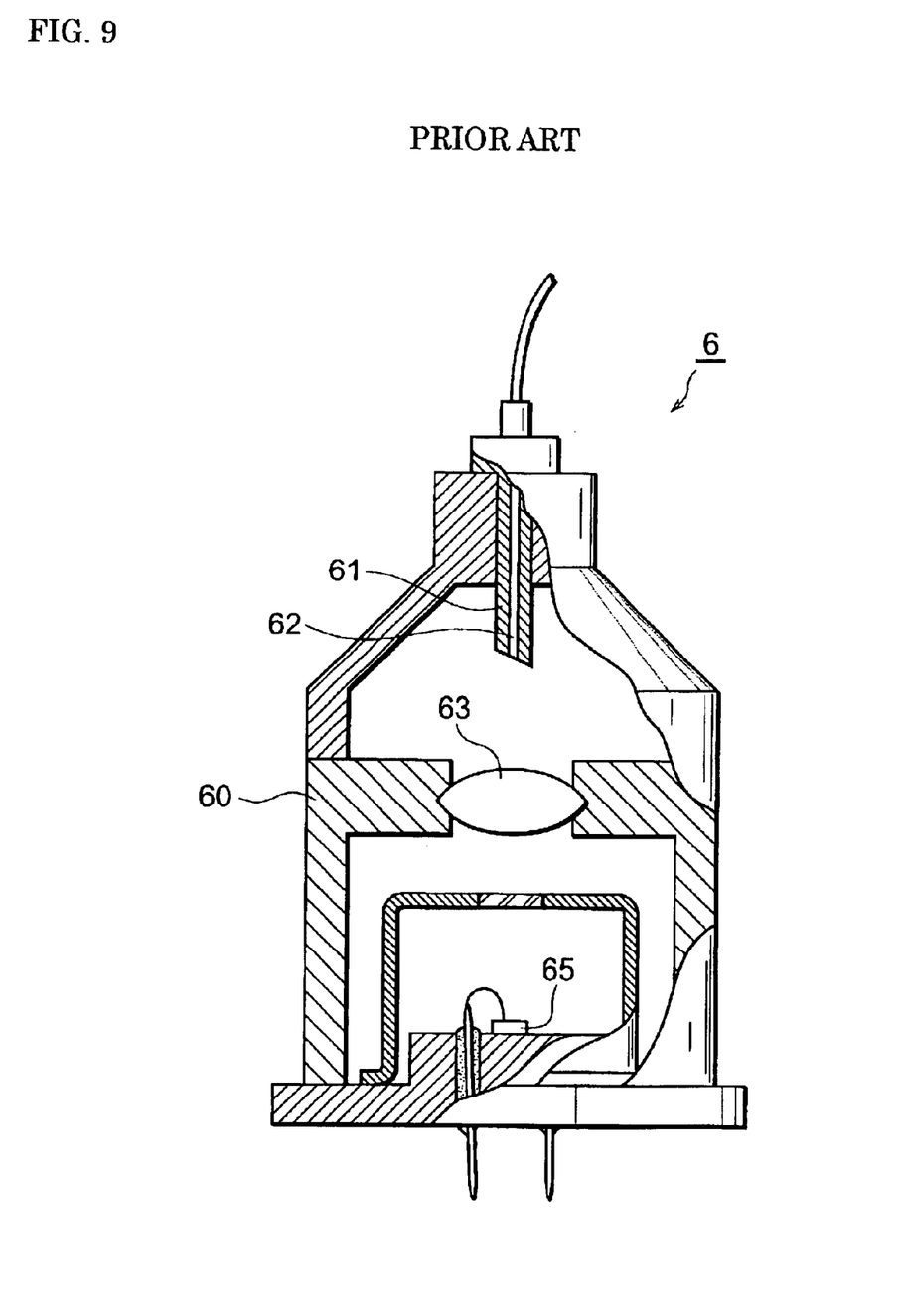
FIG. 9 is a partly cutaway side view of a conventional optical receiver module.

FIG. 9 is a partly cutaway side view showing the configuration of an example of a conventional optical receiver module. The optical receiver module 6 is a coaxial-type module in which a photodiode 65 serving as a light receiving device and the like are placed in a housing 60 such as a metal package. Inside the housing 60 of the optical receiver module 6, the photodiode 65, a ferrule 61, and a converging lens 63 are arranged such that their optical axes are aligned with one another. An optical signal inputted through an optical fiber 62 extending in the ferrule 61 is incident on a photodiode 65 via the converging lens 63, and is then converted to an electrical signal for output.

Figure 10:
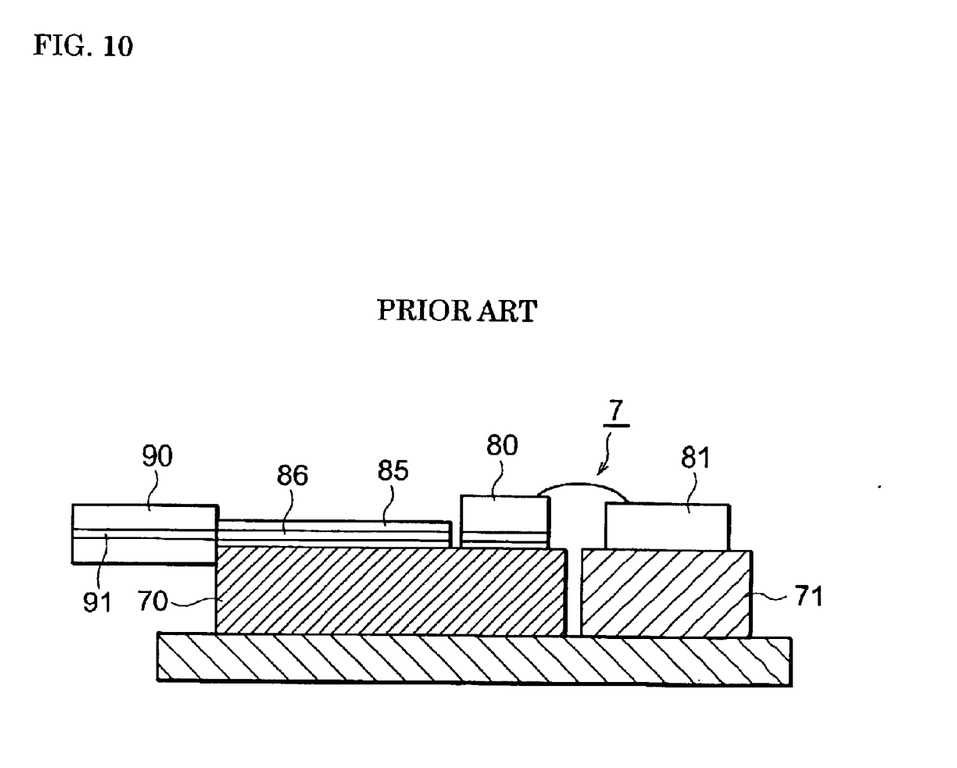
FIG. 10 is a sectional side view of another conventional optical receiver module.
Figure 11:
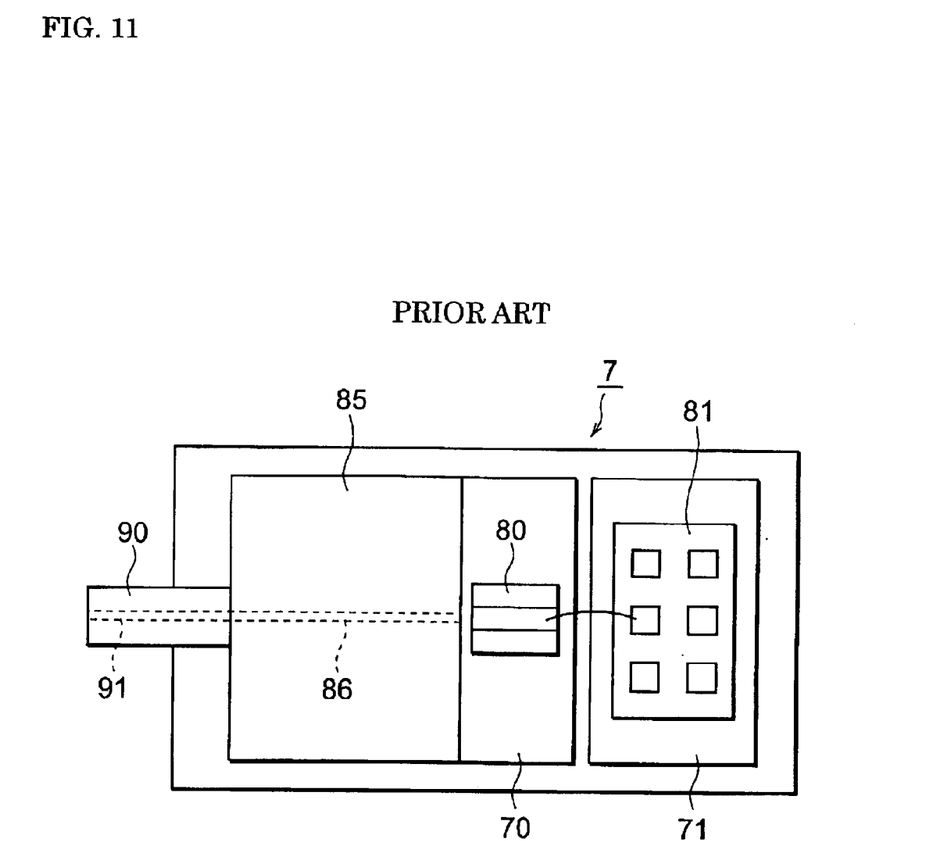
FIG. 11 is a top plan view of the optical receiver module shown in FIG. 10.

FIG. 10 is a cross-sectional side view of another conventional optical receiver module. FIG. 11 is a top plan view of the optical receiver module shown in FIG. 10. The optical receiver module 7 is a surface-mount type module in which a photodiode 80 and an optical waveguide element 85 having an optical waveguide 86 that transmits an inputted optical signal to the photodiode 80 are placed on a substrate 70

In the optical receiver module 7, a ferrule 90, the optical waveguide element 85 having the optical waveguide 86, and the photodiode 80 are arranged such that their optical axes are aligned with one another. An optical signal inputted through an optical fiber 90 extending in the ferrule 61 is incident on a photodiode 65 via the optical waveguide, and is then converted to an electrical signal for output. In the coaxial optical receiver module 6 shown in FIG. 9, the size is increased because of the three-dimensional structure, and this limits cost reduction. In contrast, in the surface-mount type optical receiver module of FIGS. 10 and 11, the size and cost of the module can be reduced. In an optical receiver module, an amplifier device may be provided for amplifying and outputting an electrical signal that has been converted from an optical signal by a light receiving device. In the coaxial optical receiver module 6 shown in FIG. 9, optical elements such as the converging lens 63, etc. and the ferrule 61 are placed upstream (upper side) of the photodiode 65, and a metal base of the housing 60 is located downstream thereof (lower side).

In the optical receiver module 6 having such a configuration, an amplifier device is placed outside the housing 60, or distanced from the photodiode 65 inside the housing 60. In this case, the connection length between the photodiode 65 and the amplifier device is long, and this increases the size of the module. Moreover, it is difficult to amplify the electrical signals from the photodiode at high speed, because of the impedance of a wire between the photodiode 65 and the amplifier device.

In the case where an amplifier device is provided in the surface-mounted optical receiver module 7 shown in FIGS. 10 and 11, the substrate 71 is placed on the downstream side relative to the photodiode 80, and the amplifier device 81 is mounted on the substrate 71. However, in such a configuration, it is difficult to sufficiently shorten the connection length between the photodiode 80 and the amplifier device 81. Moreover, since it is necessary to secure a space to provide the amplifier device 81 in addition to the optical waveguide element 85 and the photodiode, the optical receiver module is increased in size.

In recent years, optical transmission systems have been required to increase the transmission data-rate at which optical signals are transmitted for communication, for example, from 1 Gbps to 5 Gbps. Optical receiver modules for receiving optical signals are similarly required to have a higher transmission data-rate. In addition, in order to achieve optical communication systems capable of efficiently conducting multiple communications, size reduction of optical modules, such as an optical receiver module, is necessary.

SUMMARY OF THE INVENTION

The present invention has been made to meet the above requirements, and an object of the present invention is to provide a compact optical receiver module capable of high-speed receiving of optical signals.

In order to achieve the above object, the present invention provides an optical receiver module comprising: a light receiving device placed on a substrate and used for converting an optical signal into an electrical signal; an optical transmission line placed on the substrate together with the light receiving device and used for transmitting and inputting the optical signal to the light receiving device; and an amplifier device placed at a predetermined position on the same side as the optical transmission line with respect to the light receiving device, and used for amplifying the electrical signals converted by the light receiving device.

The light receiving device used in the optical receiver module may be a photodiode.

The optical transmission line may be a planar surface optical waveguide. Alternatively, the optical transmission line may be an optical fiber or an optical fiber covered with a ferrule.

In the optical receiver module, N-number (N is an integer of two or more) of said light receiving devices may be arranged in parallel, and N-number of said optical transmission lines and N-number of said amplifier devices may be arranged in parallel corresponding to said N-number of light receiving devices.

This makes it possible to receive multi-channel optical signals by the single optical receiver module, and to further reduce the size of the optical receiver module per optical signal.

A submount for mounting the amplifier device thereon may be provided between the amplifier device and the optical transmission line. This enables the amplifier device to be placed together with an optical transmission line at a suitable position on the same side as the optical transmission line relative to the light receiving device.

A metal lead frame may be provided as an electrical connecting means for directing electrical signals amplified by the amplifier device to the outside. This allows the electrical signals to be read from the outside of the optical receiver module in a preferable manner.

The light receiving device, the optical transmission line, and a predetermined optical path through which an optical signal passes may be covered by molding of a transparent resin. Alternatively, the entirety of the optical receiver module containing the substrate, the light receiving device, the optical transmission line, and the amplifier device may be molded with a resin. In this case, the components of the optical receiver module can be held reliably.

As described above in detail, the optical receiver module of the present invention has the following advantages. The above optical receiver module has a surface-mounted structure in which the light receiving device and the optical transmission line are placed on the substrate, and the amplifier device for amplifying the electrical signals is placed on the same side as the optical transmission line (upstream side) with respect to the light receiving device. Consequently, it is unnecessary to secure a space to provide the amplifier device in addition to the space for the optical transmission line and the light receiving device, and hence the size and the production cost of the module can be reduced.

Since the amplifier device can be placed close to the light receiving device, the connection length between the light receiving device and the amplifier device can be reduced substantially. Consequently, the impedance of wiring between the light receiving device and the amplifier device is reduced, and the electrical signals from the light receiving device can be amplified at high speed. As a result, it is possible to achieve an optical receiver module capable of high-speed receiving of optical signals.

Further objects, features, and advantages of the present invention will become apparent from the following description of the preferred embodiments with reference to the attached drawings.

DETAILED DESCRIPTION OF THE INVENTION

Optical receiver modules according to the preferred embodiments of the present invention will be described in detail below with reference to the attached drawings. In the drawings, the same components are denoted by the same reference numerals, and redundant descriptions thereof are omitted. The proportions adopted in the drawings and in the descriptions are not necessarily equal to each other.

Figure 1:
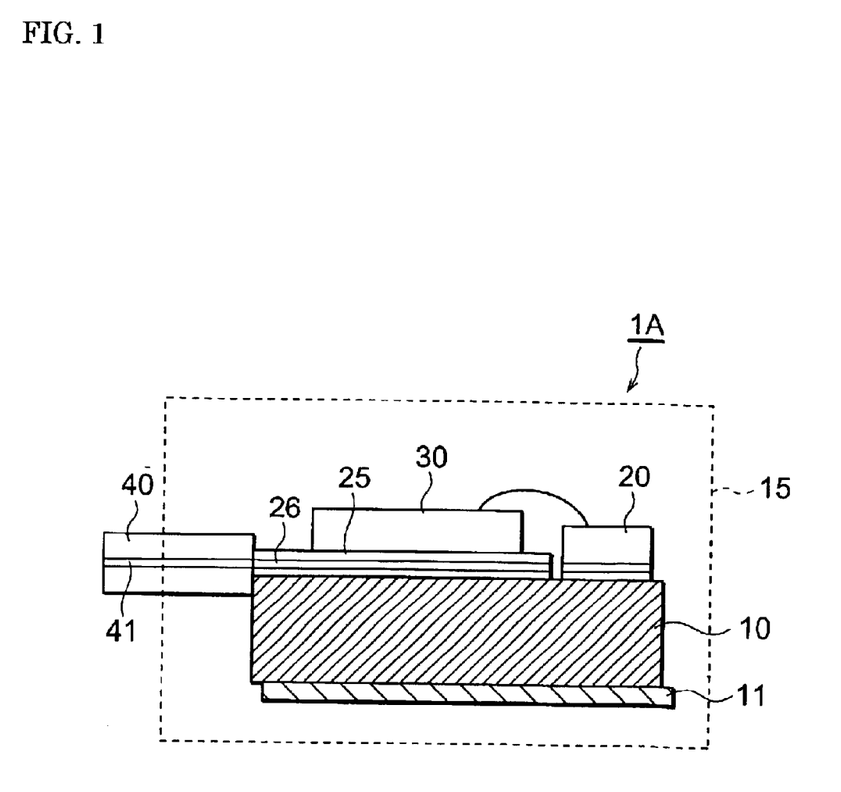
FIG. 1 is a sectional side view of an optical receiver module according to a first embodiment of the present invention.
Figure 2:
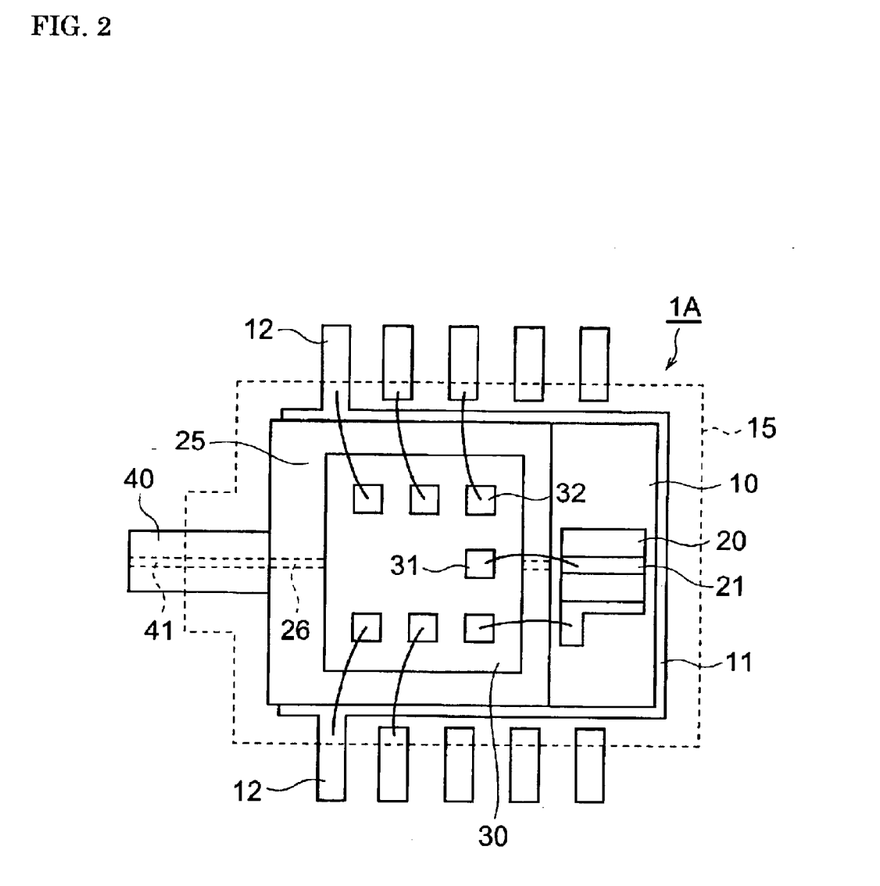
FIG. 2 is a top plan view of the optical receiver module shown in FIG. 1.

FIG. 1 is a sectional side view of an optical receiver module according to a first embodiment of the present invention. FIG. 2 is a top plan view of the optical receiver module shown in FIG. 1. The side view of the optical receiver module shown in FIG. 1 is a cross-section including the center axis thereof that is in parallel with a direction of transmission of optical-signals (lateral direction in FIG. 2) in the optical receiver module.

An optical receiver module 1A is a surface-mounted type optical module in which inputted optical signals are converted into electrical signals to be received. The optical receiver module 1A includes a substrate 10, a photodiode 20, a planar surface optical waveguide element 25, and an amplifier device 30.

The photodiode 20 is a waveguide type light receiving device for converting optical signals, which have been inputted for reception by the optical receiver module 1A, into electrical signals. The photodiode 20 is placed on the substrate 10. The optical waveguide element 25, which is also provided on the substrate 10, includes a planar surface optical waveguide 26 serving as an optical transmission line for transmitting the inputted optical signal to the photodiode 20.

The photodiode 20 and the optical waveguide element 25 are arranged such that the optical axis of the photodiode 20 and the optical axis of the optical waveguide 26 serving as the optical transmission line are aligned with each other. This allows an optical signal emitted from a downstream end of the optical waveguide 26 to efficiently enter the photodiode 20. An upstream end of the optical waveguide element 25 is connected to a ferrule 40. The ferrule 40 is placed such that the optical waveguide 26 and an optical fiber 41 extending in the ferrule 40 for inputting an optical signal are connected optically.

The amplifier device 30 is a circuit device for amplifying the electrical signals converted from optical signals by the photodiode 20. The amplifier device 30 is placed at a predetermined position on the upper surface of the optical waveguide element 25. That is, the amplifier device 30 is placed at a predetermined position on the same side as the optical waveguide 26 serving as the optical transmission line with respect to the photodiode 20. In order to input an electrical signal to the amplifier device 30, electrodes 21 of the photodiode 20 and corresponding electrodes 31 of the amplifier device 30 are electrically connected by bonding wires. The amplifier device 30 is formed of, for example, an Si—IC or a GaAs—IC.

A metal lead frame 11 provided on the bottom surface of the substrate 10 serves as an electrical connecting means for directing electrical signals amplified by the amplifier device 30 to the outside. The lead frame 11 has a predetermined number of lead pins 12 arranged on the right and left sides thereof as viewed from the center axis of the optical receiver module 1A, the center axis being in parallel with the direction of optical-signal transmission. In order to direct electrical signals amplified by the amplifier device 30 toward the outside, electrodes 32 of the amplifier device 30 and corresponding lead pins 12 of the lead frame 11 are electrically connected by bonding wires.

Figure 3:
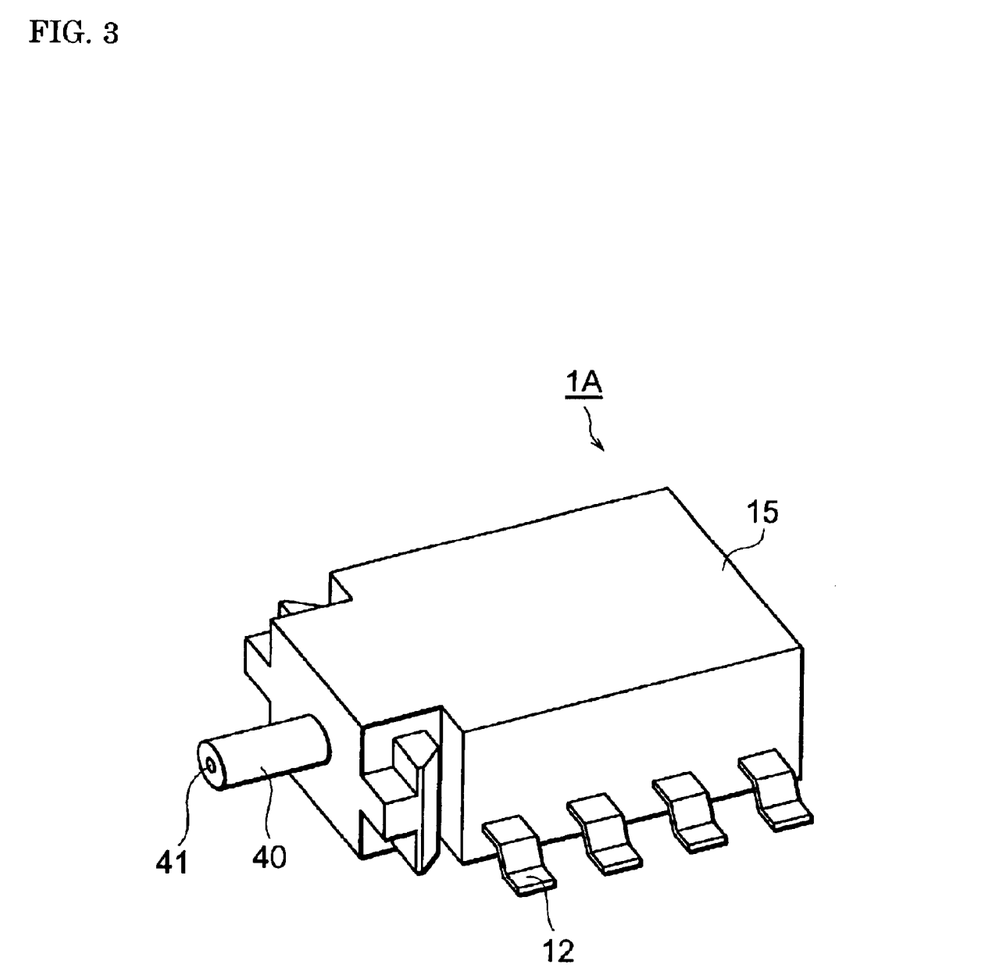
FIG. 3 is a perspective view showing the external appearance of the optical receiver module shown in FIGS. 1 and 2.

FIG. 3 is a perspective view showing the external appearance of the optical receiver module 1A shown in FIGS. 1 and 2. The entirety of optical receiver module 1A containing the substrate 10, the lead frame 11, the photodiode 20, the optical waveguide element 25 having the optical waveguide 26, and the amplifier device 30 is covered with a molding made by transfer-molding a predetermined resin. This molding forms the external shape of the optical receiver module 1A except that the lead pins 12 of the lead frame 11 and the ferrule 40 protrude outward from the resin molding 15 as shown in FIG. 3.

The photodiode 20, the optical waveguide 26 serving as the optical transmission line, and an optical path, through which optical signal passes, between the photodiode 20 and the optical waveguide 26 are filled with a transparent resin that is the same as or different from the resin of the molding 15. In FIGS. 1 and 2, only the outline of the resin molding 15 is shown by a broken line in order to show the inner configuration of the optical receiver module 1A.

In the above-described configuration, an optical signal inputted from an optical fiber 41 extending in the ferrule 40 enters the photodiode 20 via the optical waveguide 26 of the optical waveguide element 25 and the optical path between the photodiode 20 and the optical waveguide 26, and is converted into an electrical signal. The electrical signal converted from the optical signal by the photodiode 20 is inputted in the amplifier device 30, and after amplification is outputted to the outside through the corresponding lead pins 12 of the lead frame 11.

Advantages of the optical receiver module 1A of the first embodiment shown in FIGS. 1 to 3 will now be described. The optical receiver module 1A has a surface-mounted structure in which the photodiode 20 serving as the light receiving device and the optical waveguide element 25 having the optical waveguide 26 serving as the optical transmission line are placed on the substrate 10. The amplifier device 30 for amplifying an electrical signal is placed on the same side as the optical transmission line, that is, on the upstream side relative to the photodiode 20 in terms of the direction of optical-signal transmission.

This eliminates the necessity of securing a space on the downstream side, for example, to provide the amplifier device in addition to the space for the photodiode 20 and the optical waveguide element 25 serving as the optical transmission line. Accordingly, the size and cost of the optical receiver module 1A can be reduced. Moreover, an optical receiver module 1A having such structure is superior in terms of mass productivity.

Since the amplifier device 30 can be placed close to the photodiode 20, as described above, the connection length therebetween can be shortened sufficiently. Consequently, the impedance of the wires therebetween can be reduced, and the photodiode 20 can receive optical signals at high speed. As a result, it is possible to achieve an optical receiver module that can receive optical signals at high speed.

In the first embodiment, the metal lead frame 11 is used as the electrical connecting means for outputting the electrical signals amplified by the amplifier device 30 to the outside.

Since the entirety of the optical receiver module 1A containing the substrate 10, the photodiode 20, the optical waveguide element 25, and the amplifier device 30 is covered with the resin molding 15, the components of the optical receiver module 1A can be held reliably. Furthermore, since the photodiode 20, the optical waveguide element 25, and the predetermined optical paths through which an optical signal passes are filled with transparent resin, the components of the optical receiver module 1A can be held reliably, and optical signals can be transmitted at a sufficient transmittance.

It is preferable to use as the transparent resin a resin that can sufficiently transmit light having a wavelength corresponding to an optical signal to be received by the optical receiver module 1A. The resin for the molding 15 of the entire module may be transparent, although it is not of essential necessity. The entire receiver module may have a formation other than a resin molding, depending on its specific configuration, for example.

An example of a production method and a configuration for the optical receiver module 1A of the first embodiment will now be described.

In the first embodiment, first, a (100) Si substrate (for example, 3 mm×7 mm×1.5 mm) is prepared as a substrate 10. Then, a thermal oxide film made of $SiO_2$ is formed on the Si substrate 10, and thereon formed in the enumerated order are an under-cladding layer (10 $\mu$m in thickness) made of $SiO_2$, a core layer (6 $\mu$m×6 $\mu$m) made of $SiO_2$—$GeO_2$ and having a linear waveguide pattern corresponding to an optical waveguide 26, and an over-cladding layer (10 $\mu$m in thickness) made of $SiO_2$. The multilayer structure thus obtained forms a planar surface optical waveguide element 25.

Subsequently, in the multilayer structure formed as the optical waveguide element 25, a portion thereof, where a photodiode is to be placed, within a predetermined area on the Si substrate 10, is removed by etching, and a metalized layer (metalized pattern) is formed in the portion so that the photodiode 20 is to be soldered thereon. A photodiode 20 is mounted at predetermined positions on the Si substrate 10, and an amplifier device 30 is mounted at a predetermined position on the optical waveguide element 25, and corresponding electrodes are interconnected with Au or Al wires by wire bonding.

Subsequently, the substrate 10 is bonded to a base metal of a lead frame 11. A ferrule 40 through which an optical fiber 41 extends is fixed to abut an optical waveguide 26 of the optical waveguide element 26. The photodiode 20, an optical waveguide 26, and an optical path portion through which light passes between the photodiode 20 and the optical waveguide 26 are potted with a silicone resin as the transparent resin. Furthermore, the entirety thus formed is transfer-molded with epoxy resin to form the resin molding 15 that constitutes an external shape of the module.

According to the above-described constitution and production method, the optical receiver module 1A shown in FIGS. 1 to 3 can be suitably produced. The configuration of the optical receiver module and the production method therefor are not limited to those in the above first embodiment. For example, instead of the Si substrate, a ceramic ($Al_2O_3$) substrate may be used as the substrate 10.

Figure 4:
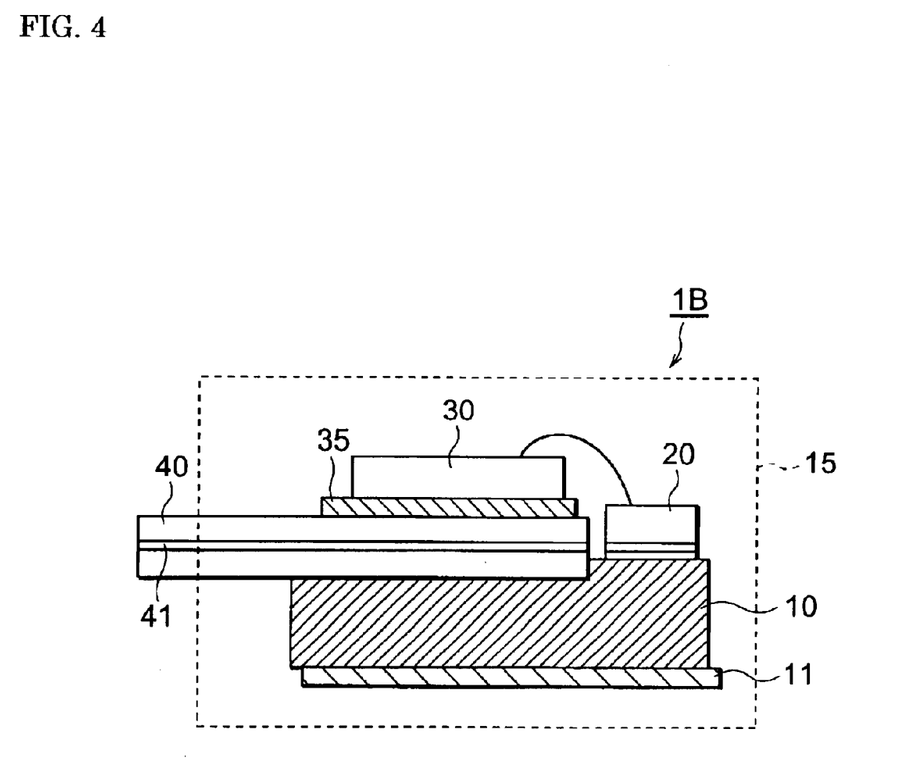
FIG. 4 is a sectional side view of an optical receiver module according to a second embodiment of the present invention.
Figure 5:
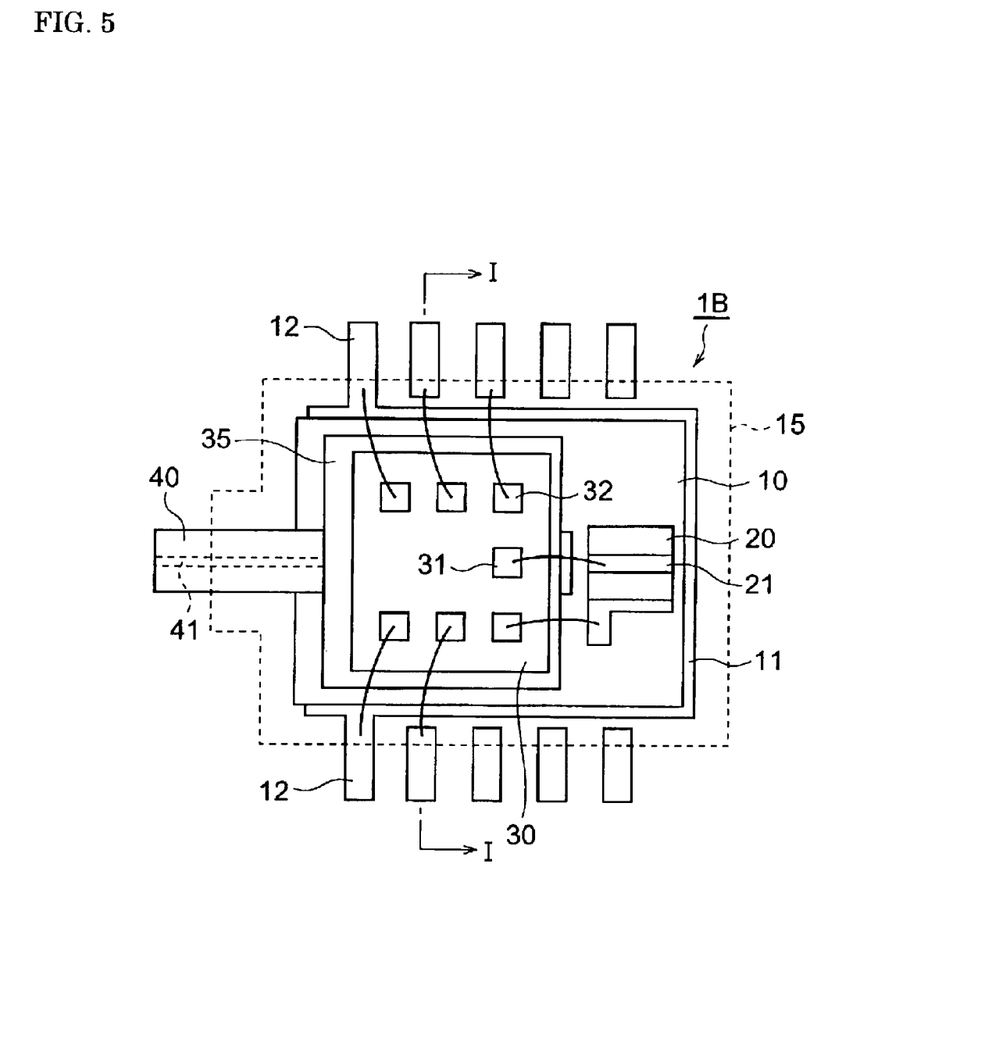
FIG. 5 is a top plan view of the optical receiver module shown in FIG. 4.

FIG. 4 is a sectional side view of an optical receiver module according to a second embodiment of the present invention. FIG. 5 is a top plan view of the optical receiver module shown in FIG. 4. An optical receiver module 1B of the second embodiment is a surface-mounted type optical receiver module that includes a substrate 10, a photodiode 20, and an amplifier device 30.

The photodiode 20 is a light receiving device for receiving an inputted optical signal that is to be received by the optical receiver module and converting the optical signal into an electrical signal. The photodiode 20 is placed on the substrate 10. A ferrule 40 is also placed on the substrate 10. An optical fiber 41 serving as an optical transmission line for transmitting an inputted optical signal is provided extending in the ferrule 40.

The photodiode 20 and the optical fiber having ferrule 40 are arranged such that the optical axis of the photodiode 20 and the optical axis of the optical fiber 41 serving as the optical transmission line are aligned with each other. This allows an optical signal emitted from a downstream end of the optical fiber 41 to efficiently enter the photodiode 20.

The amplifier device 30 is a circuit device for amplifying an electrical signal, and is placed at a predetermined position above the ferrule 40 containing the optical fiber. That is, the amplifier device 30 is placed at a predetermined position on the same side as the ferrule 40 and the optical fiber 41 for an optical transmission line relative to the photodiode 20. In order to input an electrical signal from photodiode 20 to the amplifier device 30, the electrodes 21 of the photodiode 20 and the corresponding electrodes 31 of the amplifier device 30 are electrically connected by bonding wires.

Figure 6:
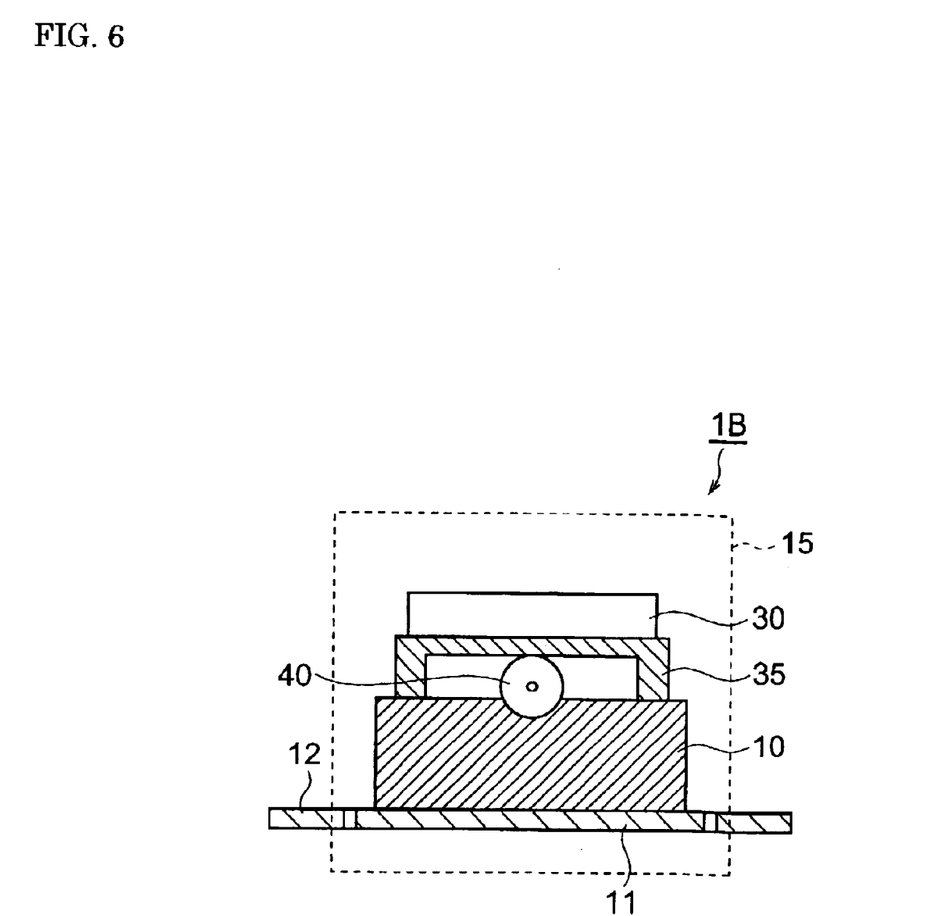
FIG. 6 is a cross-sectional view of the optical receiver module shown in FIGS. 4 and 5, as taken along the lines I—I in FIG. 5.

FIG. 6 is a cross-sectional view of the optical receiver module 1B, taken along the lines I—I in FIGS. 4 and 5. In the second embodiment, as shown in FIG. 6, a submount 35 which crosses over the ferrule 40 containing the optical fiber is placed on the substrate 10 and between the amplifier device 30 and the ferrule 40 containing the optical fiber 41 for the optical transmission line such that the amplifier device 30 is placed on the upper surface of the submount 35.

A metal lead frame 11 having a predetermined number of lead pins 12 arranged on the right and left sides thereof is provided on the bottom face of the substrate 10. In order to output electrical signals amplified by the amplifier device 30, electrodes 32 of the amplifier device 30 and corresponding lead pins 12 of the lead frame 11 are electrically connected by bonding wires.

In the optical receiver module 1B, the entirety thereof containing the substrate 10, the lead frame 11, the photodiode 20, the ferrule 40 having the optical fiber 41 extending therein, and the amplifier device 30 is made of a molding formed by transfer-molding with a predetermined resin such that the molding forms the exterior shape of the optical receiver module 1B. However, the lead pins 12 of the lead frame 11 and the ferrule 40 having the optical fiber therein protrude outward from the resin molding 15. The photodiode 20, the optical fiber 41 for the optical transmission line, and an optical path through which an optical signal passes between the photodiode 20 and the optical fiber 41 are filled with a transparent resin that is the same as or different from the resin molding 15.

In the above-described configuration, an optical signal inputted into an optical fiber 41 extending in the ferrule 40 enters the photodiode 20 via the optical fiber 41 and the optical path between the photodiode 20 and the optical fiber 41, and is converted into the electrical signal. The electrical signals converted from the optical signals by the photodiode 20 are inputted into the amplifier device 30 and after amplification are outputted therefrom to the outside through the corresponding lead pins 12 of the lead frame 11.

Advantages of the optical receiver module 1B of the second embodiment shown in FIGS. 4 to 6 will now be described. The optical receiver module 1B has a surface-mounted structure, and the amplifier device 30 is placed on the same side as the optical transmission line (on the upstream side) relative to the photodiode 20. Accordingly, the size of the optical receiver module 1B can be reduced. Furthermore, since the amplifier device 30 is placed close to the photodiode 20, the connection length therebetween can be shortened sufficiently, and the photodiode 20 can receive optical signals at high speed. Therefore, it is possible to achieve an optical receiver module that can receive optical signals at high speed.

In the second embodiment, the amplifier device 30 is placed on the submount 35. Because of using the submount 35, the amplifier device 30 can be properly placed on the same side as the optical transmission line relative to the photodiode 20. For example, in a case in which the optical fiber having ferrule 40 is used as the optical transmission line for transmitting an optical signal to the photodiode 20, as in the second embodiment, by providing the submount 35 that crosses over the ferrule 40, the amplifier device 30 can be positioned such that it does not touch the portion of the ferrule 40 protruding on the substrate.

Figure 7:
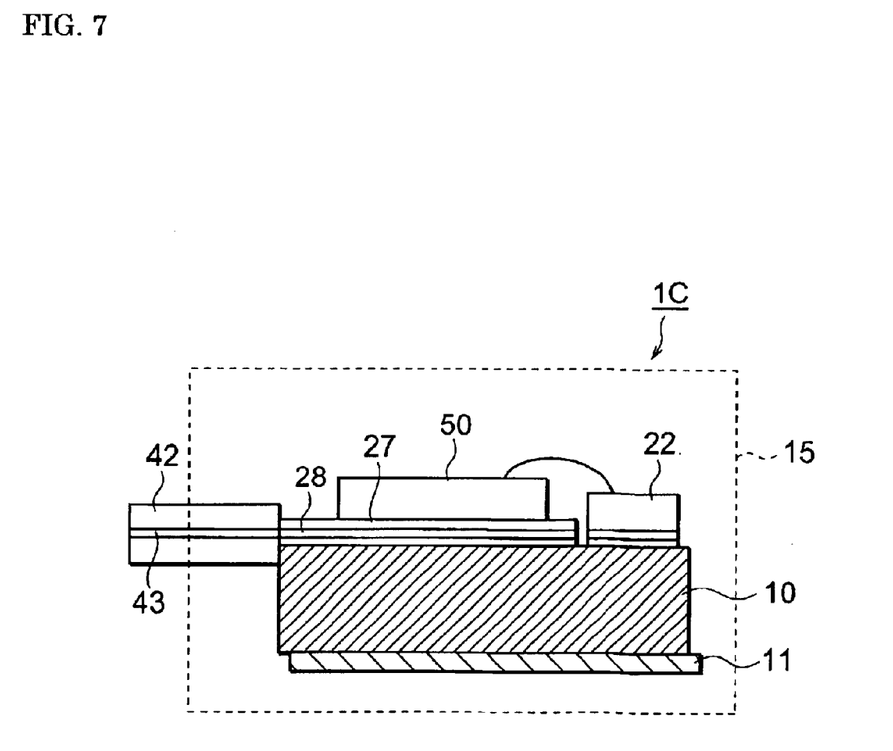
FIG. 7 is a sectional side view of an optical receiver module according to a third embodiment of the present invention.
Figure 8:
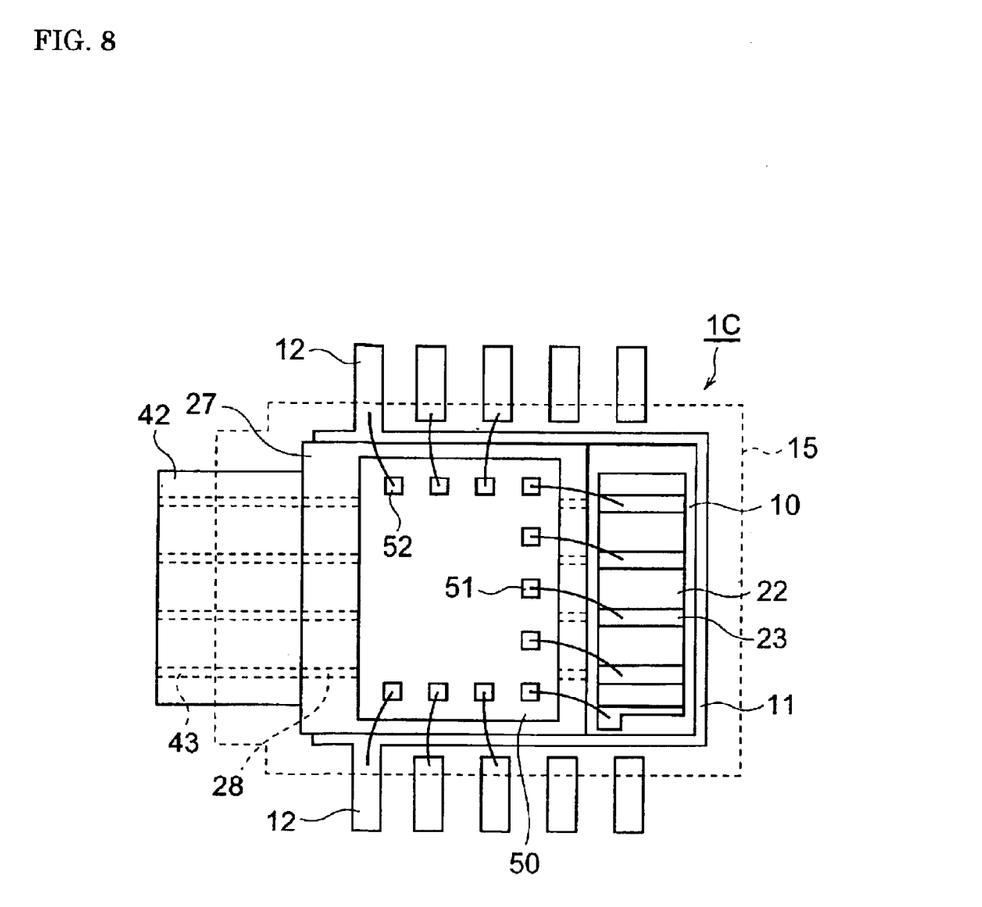
FIG. 8 is a top plan view of the optical receiver module shown in FIG. 7.

FIG. 7 is a sectional side view of an optical receiver module according to a third embodiment of the present invention. FIG. 8 is a top plan view of the optical receiver module shown in FIG. 7. An optical receiver module 1C is a surface-mounted type optical receiver module that includes a substrate 10, a photodiode array 22, a planar surface optical waveguide element 27, and an amplifier device 50.

The photodiode array 22, which is provided on the substrate, is a light receiving device array in which N-number (N is an integer of two or more) of photodiodes serving as light receiving devices are arranged in parallel so as to convert respective optical signals into electrical signals with respect to N-channels of optical signals to be received by the optical receiver module 1C. FIGS. 7 and 8 show a four-channel structure (N is four) as an example.

In addition to the photodiode array 22, the optical waveguide element 27 is also placed on the substrate 10. The optical waveguide element 27 has N-number of planar surface optical waveguides 28 serving as optical transmission lines for transmitting N-channels of optical signals to the corresponding photodiodes. The N-number of optical waveguides 28 is arranged in parallel corresponding to the N-number of photodiodes of the photodiode array 22.

The photodiode array 22 and the optical waveguide element 27 are arranged such that the optical axes of the photodiodes and the optical axes of the corresponding optical waveguides 28 serving as the optical transmission lines are aligned with each other. This allows optical signals emitted from downstream ends of the optical waveguides 28 to efficiently enter the corresponding photodiodes of the photodiode array 22.

A ferrule 42 is connected to the upstream end of the optical waveguide element 27. The ferrule 42 has a structure that can form an optical fiber ribbon such that N-number of optical fibers 43 for inputting optical signals extend in parallel therein as shown in FIG. 8. The ferrule 42 is placed such that the optical fibers 43 are optically connected to the corresponding optical waveguides 28.

The amplifier device 50 is a circuit device that has N-number of amplifiers for amplifying electrical signals converted from optical signals by N-number of photodiodes of the photodiode array 22 The amplifier device 50 is placed at a predetermined position on the upper surface of the optical waveguide element 27. That is, the amplifier device 50 is placed at a predetermined position on the same side as the optical waveguides 28 serving as the optical transmission lines, relative to the photodiode array 22. In order to input electrical signals from the respective photo diodes of the photodiode array 22 to N-number of corresponding amplifiers of the amplifier device 50, the respective electrodes 23 of the photodiode array 22 and the corresponding electrodes 51 of the amplifier device 50 are electrically connected by bonding wires, respectively.

A metal lead frame 11 is provided on the bottom face of the substrate 10. The lead frame 11 functions as an electrical connecting means to output the electrical signals amplified by each of N amplifiers of the amplifier device 50. The lead frame 11 has a predetermined number of lead pins, and on both right and left sides of the center axis thereof, which is in parallel with the direction of transmission of optical-signals in the optical receiver module 1C. In order to output electrical signals amplified by the N-number of respective amplifiers of the amplifier device 50, the respective electrodes 52 of the amplifier device 50 and the corresponding lead pins 12 of the lead frame 11 are electrically connected by bonding wires.

In the optical receiver module 1C, the entirety thereof containing the substrate 10, the lead frame 11, the photodiode array 22, the optical waveguide element 27 having the optical waveguides 28, and the amplifier device 50 is transfer-molded with a predetermined resin, and the resin molding 15 thus formed defines the exterior shape of the optical receiver module 1C. However, the lead pins 12 of the lead frame 11 and the ferrule 42 protrude outward from the resin molding 15. The photodiode array 22, the optical waveguides 28 serving as the optical transmission lines, and an optical path through which an optical signal passes between the photodiode array 22 and the optical waveguides 28 are filled with a transparent resin that is the same as or different from the resin of the resin molding 15.

In the above-described configuration, N-channels of optical signals inputted from the individual N-channels of optical fibers 43 inserted in the ferrule 42 enter the N-number of photodiodes of the photodiode array 22, respectively, via the optical waveguides 28 of the optical waveguide element 27 and paths between the optical waveguides 28 and the photodiodes, and are then converted into electrical signals. The respective electrical signals converted from optical signals of N-channels by the photodiode array 22 are inputted into the amplifier device 50, and after amplification are outputted from the corresponding lead pins 12 of the lead frame 11.

Advantages of the optical receiver module 1C of the third embodiment will be described. The optical receiver module 1C shown in FIGS. 7 and 8 has a surface-mounted structure, and the amplifier device 50 is placed on the same side as the optical transmission lines (upstream side) relative to the photodiode array 22. This can reduce the size of the optical receiver module 1C. Moreover, since the amplifier device 50 is placed close to the photodiode array 22, the connection lengths between the photodiodes of the photodiode array 22 and the corresponding amplifiers of the amplifier device 50 can be sufficiently reduced. Consequently, the photodiodes can receive optical signals at high speed, and the optical receiver module 1C is capable of high-speed receiving of optical signals, accordingly.

In the third embodiment, the photodiode array 22 including N-number (N is an integer of two or more) of photodiodes arranged in parallel therein is used as the light receiving device, and the optical waveguide element 27 including N-number of optical waveguides 28 arranged in parallel therein and the amplifier device 50 including N-number of amplifiers arranged in parallel therein, each corresponding to the N-number of photodiodes, are used as the optical transmission lines and the amplifiers, respectively. Consequently, N-channel (multiple-channel) optical signals can be received by the single optical receiver module 1C, and the size of the optical receiver module per optical signal can be reduced further.

The optical receiver module of the present invention is not limited to the above-described embodiments, and various modifications are possible. For example, photodiodes other than waveguide type in FIG. 1 are available. Surface-illuminated type or rear-illuminated type photodiodes are also available. A device other than the photodiode may be used as the light receiving device for converting an optical signal into an electrical signal. The optical transmission line is not limited to the planar surface optical waveguide and the optical fiber having ferrule, and for example, an optical fiber having no ferrule may be used.

While the planar surface optical waveguides are used as the optical transmission lines for transmitting N-channel optical signals to the light receiving devices in the optical receiver module 1C shown in FIGS. 7 and 8, a similar structure is also available in a case in which N-number of optical fibers are used as the optical transmission lines.

What is claimed is:

1. An optical receiver module comprising:
   a substrate;
   a light receiving device placed on said substrate and used for converting an optical signal into an electrical signal;
   an optical transmission line disposed on said substrate together with said light receiving device and used for transmitting the optical signal to said light receiving device; and
   an amplifier device for amplifying said electrical signal converted from the optical signal by said light receiving device, said amplifier device being placed at a predetermined position on the same side as said optical transmission line relative to said light receiving device.

2. An optical receiver module according to claim 1, wherein said light receiving device is composed of a photodiode.

3. An optical receiver module according to claim 1, wherein said optical transmission line is composed of a planar surface optical waveguide.

4. An optical receiver module according to claim 1, wherein said optical transmission line is composed of an optical fiber or a ferrule having an optical fiber extending therein.

5. An optical receiver module according to claim 1, wherein N-number (N is an integer of two or more) of said light receiving devices are arranged in parallel, and N-number of said optical transmission lines and N-number of said amplifier devices are arranged, respectively in parallel, corresponding to said N-number of light receiving devices.

6. An optical receiver module according to claim 1, further comprising:
   a submount for mounting said amplifier device thereon, said submount being provided between said amplifier device and said optical transmission line.

7. An optical receiver module according to claim 1, further comprising:
   a metal lead frame serving as electrical connecting means for outputting said electrical signals amplified by said amplifier device to the outside.

8. An optical receiver module according to claim 1, wherein said light receiving device, said optical transmission line, and a predetermined optical path through which an optical signal passes are filled with a transparent resin.

9. An optical receiver module according to claim 1, wherein the entirety of said optical transmission module containing said substrate, said light receiving device, said optical transmission line, and said amplifier device is covered with a resin molding.

* * * * *